United States Patent
Yoshimura et al.

[11] Patent Number: 6,074,279
[45] Date of Patent: Jun. 13, 2000

[54] PROCESS FOR PRODUCING SPUTTERING TARGET

[75] Inventors: Ryoji Yoshimura; Yasufumi Tsubakihara, both of Yamagata; Kentaro Utsumi, Yokohama, all of Japan

[73] Assignee: Tosoh Corporation, Shinnanyo, Japan

[21] Appl. No.: 09/031,548

[22] Filed: Feb. 27, 1998

[30] Foreign Application Priority Data

Feb. 28, 1997 [JP] Japan ................................ 9-045913

[51] Int. Cl.$^7$ ........................................ B24B 1/00
[52] U.S. Cl. .................................. 451/37; 451/38; 451/39
[58] Field of Search ............................... 451/37, 38, 39, 451/40, 57

[56] References Cited

U.S. PATENT DOCUMENTS

| | | | |
|---|---|---|---|
| 3,662,501 | 5/1972 | Mendel | 451/37 |
| 3,939,613 | 2/1976 | Ayers | 451/39 |
| 4,714,528 | 12/1987 | Takeuchi et al. | 451/40 X |
| 4,909,894 | 3/1990 | Uesugi et al. | 451/57 X |
| 5,160,675 | 11/1992 | Iwannoto et al. | |
| 5,409,415 | 4/1995 | Kawanami et al. | 451/39 |
| 5,455,078 | 10/1995 | Kanzaki | 451/39 X |

FOREIGN PATENT DOCUMENTS

| | | |
|---|---|---|
| 196 21 580 | 12/1998 | Germany . |
| 7-316804 | 12/1995 | Japan . |
| 8-277466 | 10/1996 | Japan . |
| 9-104973 | 4/1997 | Japan . |

*Primary Examiner*—Timothy V. Eley
*Attorney, Agent, or Firm*—Oblon, Spivak, McClelland, Maier & Neustadt, P.C.

[57] ABSTRACT

The surface to be sputtered of a sputtering target is blasted with a blasting material in the form of a finely divided powder having particle diameters falling within the range of 10 to 500 $\mu$m to remove impurities staining the surface to be sputtered. This blasting treatment is suitable especially for a sputtering surface having a raised portion thereon. Preferably the blasting treatment is effected in two stages: in the first stage, a blasting material powder with particle diameters of 50 to 500 $\mu$m is used and, in the second stage, a blasting material powder with particle diameters of 10 to 110 $\mu$m is used. The blast-treated surface has a uniform, isotropic and reduced surface roughness.

8 Claims, 3 Drawing Sheets

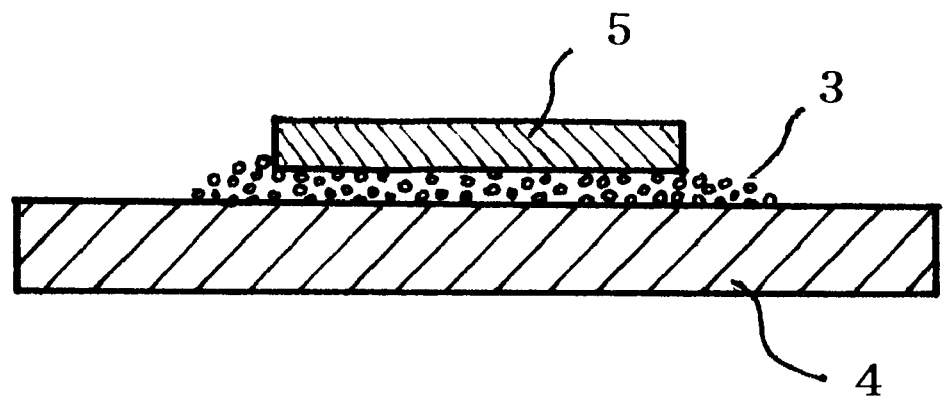
F I G. 1
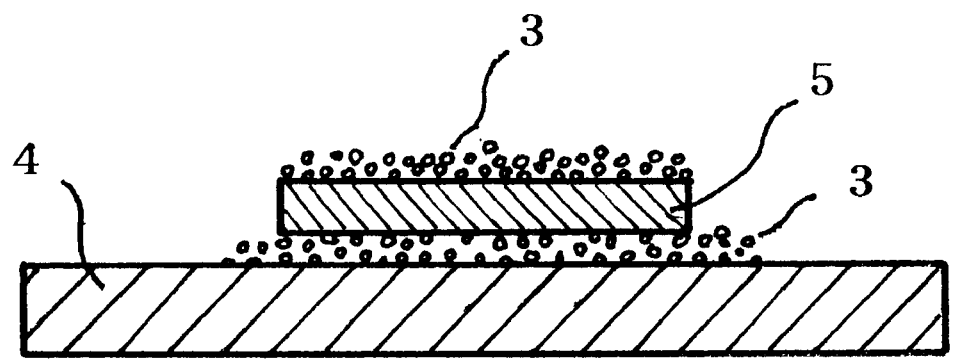
F I G. 2

PROCESS FOR PRODUCING SPUTTERING TARGET

BACKGROUND OF THE INVENTION

1. Field of the Invention

This invention relates to a process for producing a sputtering target used for the formation of a thin film by sputtering. More specifically, it relates to a method of treating the surface to be sputtered of a sputtering target.

2. Description of the Related Art

The formation of a thin film by sputtering is characterized in that the adhesion of the thin film is strong; the film thickness can easily be controlled; when the thin film is formed from an alloy, the reproducibility of alloy composition is excellent; the thin film can be produced from a material with a high melting temperature. Therefore, the thin film formation by sputtering is widely employed in various uses including, for example, transparent electrically conductive films for liquid crystal displays, recording layers of hard discs and lead metals for semiconductor memories.

The composition of sputtering targets varies depending upon the particular use thereof. For example, sputtering targets are made of chromium, molybdenum, carbon, aluminum, ITO (indium oxide-tin oxide), ZAO (zinc oxide-aluminum oxide) and STO (strontium titanate). In general, sputtering targets are made by various methods wherein a sputtering target-forming material is shaped and sintered, which include, for example, a hot isostatic pressing (HIP) method, a pressureless sintering method or a vacuum induction melting method, followed by machining into a desired size (these shaping and sintering methods are generically referred to as the "shaping-sintering method").

The machining is carried out for obtaining a target of a desired size with high precision and for removing a surface layer stained with impurities. The machining is usually conducted by using a machining center, a surface grinding machine and a milling machine. (A substantially long time is required the operation of machining.)

Among the methods of forming a thin film by sputtering, magnetron sputtering has become increasingly prevalent which is characterized as forming a plasma with a high ionic current density by an interaction between the electric field and the magnetic field in the closed magnetic field formed on a target by an electromagnet or a permanent magnet, attached on the backside of the target. In the magnetron sputtering, film formation can be effected at a high rate under a relatively low gas pressure, but the ionic current density on the target surface is difficult to make uniform, and thus, the target is eroded non-uniformly at sputtering.

To solve the problem of magnetron sputtering, the present inventors have proposed a high-efficiency target in Japanese Unexamined Patent Publication No. 1-290764, which is characterized as having enhanced utilization because the target is thick in an erosion region in which the ionic current density is high and sputtering occurs intensely and is thin in a non-erosion region in which sputtering occurs to the least extent.

The target surface of the high-efficiency target is not planar but has a raised portion thereon. Therefore, after the target is sintered, the surface machining is difficult to conduct, and thus, it is difficult or even impossible to remove impurities from the target surface and further to polish the target surface for providing a smooth surface.

SUMMARY OF THE INVENTION

In view of the foregoing, an object of the present invention is to provide a method for removing impurities from the target surface by an expedient means with great efficiency. By the method of the present invention, the removal of impurities can be effected even when the surface of a shaped and sintered target is not planar, and a target having a smooth surface with an isotropic and reduced surface roughness can be obtained.

It now has been found that, when a blasting material in the form of a finely divided powder is impinged upon the target surface at a high rate, impurities on the target surface can be removed in an expedient manner with great efficiency with the result that a target having a surface roughness with an isotropic and reduced surface roughness is produced. Especially when the particle diameter of the blasting material is in a specific range, the surface roughness of the target can be minimized while a high efficiency of removing impurities is maintained.

In the process of producing the ITO sputtering target, the content of tin oxide in the surface layer of the shaped body for sputtering target is undesirably reduced by sintering which leads to deterioration of sputtering performance. It now has been found that, when the sintered shaped body is blast-treated by the process of the present invention, the surface layer is renewed and the content of tin oxide is restored to the level before the blast-treatment.

In one aspect of the present invention, there is provided a process for preparing a sputtering target which comprises a step of blasting the surface to be sputtered of a sputtering target with a blasting material in the form of a finely divided powder having particle diameters falling within the range of 10 to 500 $\mu$m to remove impurities staining the surface to be sputtered. The blasting material used is preferably a zirconia powder composed of spherical finely divided particles.

In another aspect of the present invention, there is provided a process for preparing a sputtering target which comprises the steps of (1) blasting the surface to be sputtered of a sputtering target with a blasting material in the form of a finely divided powder having particle diameters falling within the range of 50 to 500 $\mu$m; and then, (2) further blasting the thus-blasted surface with a blasting material in the form of a finely divided powder having particle diameters falling within the range of 10 to 110 $\mu$m to remove impurities staining the surface to be sputtered; wherein the blasting material used in the step (1) is composed of a substance different from that of the blasting material used in the step (2), or, the center value of the particle diameters of the blasting material used in the step (1) is larger than the center value of the particle diameters of the blasting material used in the step (2). Preferably, the blasting material used in the step (1) is selected from the group consisting of a finely divided alumina powder and a finely divided carbon silicide powder, and the blasting material used in the step (2) is a zirconia powder composed of spherical finely divided particles.

The process of the present invention is especially suitable for removing impurities such as, for example, aluminum from the surface to be sputtered of a sputtering target having a raised portion on the surface.

BRIEF DESCRIPTION OF THE DRAWINGS

FIG. 1 is a diagramatic representation of a step of sintering for the preparation of an ITO shaped body used in a working example of the invention;

FIG. 2 is a diagramatic representation of a step of sintering for the preparation of another ITO shaped body used in a working example of the invention;

FIG. 3b is a cross-sectional view taken on line A—A of FIG. 3a; and

DESCRIPTION OF THE PREFERRED EMBODIMENTS

Figure 3A:
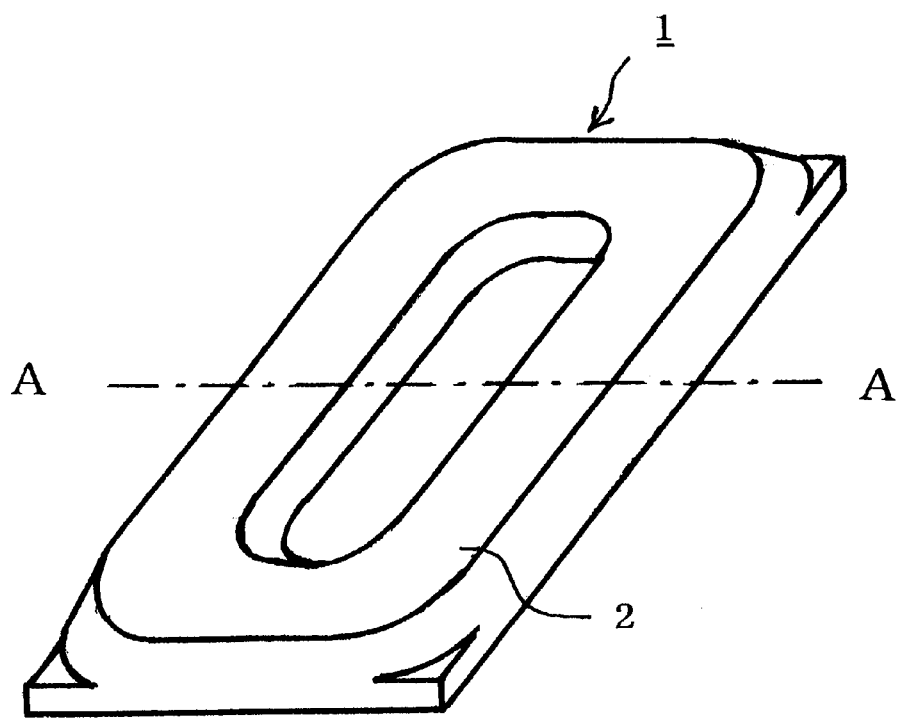
FIG. 3a is a perspective illustration of one example of a high-efficiency sputtering target.

The process for the preparation of a sputtering target of the present invention is characterized as including a step of blasting the sputtering surface of a sputtering target.

The sputtering target to be blast-treated in the process of the present invention is not particularly limited, and any conventional sputtering targets may be used. In general, the sputtering targets are prepared as follows. A raw material powder, which may be composed of a single ingredient or two or more ingredients, and additives such as a binder and a dispersant are mixed together, and the mixture is molded into a molding of a desired shape for example, by a casting, injection molding or press-molding method. If desired, the molding is subjected to compaction by, for example, cold isotropic pressing, and the binder or other organic substances may be removed from the molding. The molding is sintered, for example, by a pressureless sintering or HIP sintering method, and, if desired, is subjected to machining to give a sputtering target of a predetermined shape. In the case where a sputtering target made of metal is prepared, a metal material may be subjected to machining to give a sputtering target of a predetermined shape.

In the process of the present invention, at least the surface to be sputtered of a sputtering target is subjected to blasting. By the term "blasting" herein used we mean a treatment of removing impurities, deposits and/or projections on the surface to be sputtered of a sputtering target by allowing a blasting material in the form of finely divided powder to impinge upon the sputtering surface. The blasting can be conducted by, for example, jetting a blasting material-containing gas such as air or a blasting material-containing liquid such as water onto the target surface whereby the blasting material is allowed to impinge at a high rate upon the target surface.

As the apparatus used for blasting, commercially available blasting apparatuses may be used, which include, for example, a blasting apparatus of the type wherein a blasting material-containing compressed air is jetted ("Pneuma-Blaster SGF-5-B" supplied by Fuji Mfg. Co., Japan).

As examples of the blasting material, there can be mentioned finely divided powders of alumina, glass, zirconia and SiC. Especially a finely divided zirconia powder composed of spherical particles is preferable because the blasted target surface is not readily stained with impurities and the surface roughness can be minimized.

The particle shape of the blasting material is not particularly limited and is usually spherical, needle-like or granular. Generally when irregularly shaped particles such as needle-like particles are used, the impurities can be more easily removed from the surface, and when spherical particles are used, the surface roughness can be reduced to a good extent. The particle size of the blasting material is such that the particle diameter falls within the range of 10 to 500 $\mu$m, preferably 10 to 200 $\mu$m. If the particle size is too large, the surface roughness of the blasted target surface is not reduced to the desired extent and nodules often occur at sputtering. In contrast, if the particle size is too small, the removal of impurities from the target surface becomes difficult.

The blasting material used is usually prepared by classification using, for example, a sieve. The particle diameter of the blasting material is determined by the size of mesh, i.e., each opening between the threads or cords of a sieve. Thus the blasting material having a particle diameter of 10 to 500 $\mu$m is obtained by classification using two kinds of sieves having a mesh size falling within the range of 10 to 500 $\mu$m, for example, one of which has a mesh size of 125 $\mu$m and the other of which has a mesh size of 149 $\mu$m, or one of which has a mesh size of 177 $\mu$m and the other of which has a mesh size of 210 $\mu$m.

In blasting procedure, a fluid medium such as air containing a finely divided powder of a blasting material is blown against the target surface whereby the finely divided powder is allowed to impinge upon the target surface. The blasting pressure at which the finely divided powder-containing fluid medium is blown against the target surface is usually in the range of 1 to 10 kg/cm$^2$, preferably 2 to 7 kg/cm$^2$ and more preferably 3 to 5 kg/cm$^2$. When the blasting pressure is too low, the removal of impurities from the target surface becomes difficult. In contrast when the blasting pressure is too high, the blasting material impacts intensely on the target surface and sometimes cause crack formation, and in addition, a compressor having a large capacity is needed and the blasting becomes costly.

The distance between a blasting nozzle and the target surface is preferably in the range of about 50 to about 300 mm. If the distance is too small, the blasting becomes difficult to effect over a broad region on the target surface. In contrast, if the distance is too large, a substantial long time is required for the completion of blasting.

The blasting time varies depending upon the particular blasting pressure and the kind of blasting material, but is preferably in the range of 0.05 to 1.0 second/cm$^2$. When the blasting time is too short, the impurities are difficult to remove to the desired extent from the target surface. When the blasting time is too long, the blasting efficiency is low and a problem of staining the target surface with the blasting material arises. Thus, when the blasting is carried out over a long period of time, the same material as the sputtering target should preferably be used as the blasting material.

Preferably a suitable particle size of the blasting material is chosen within the particle diameter range of 10 to 500 $\mu$m. If impurities are weakly adhered on the target surface, a blasting material having a particle diameter of 10 to 500 $\mu$m is preferably used. By using a blasting material with this particle diameter, the impurities can be effectively removed from the target surface and the surface roughness (Ra) of the target surface can be reduced to a value of 0.5 to 4 $\mu$m. Especially when the blasting material having a particle diameter of this range is spherical zirconia particles, the surface roughness (Ra) can be reduced to the smallest value.

In contrast if the impurities are strongly adhered on the target surface, the blasting should preferably be carried out in at least two stages employing different conditions, for example, by using blasting materials different in substance, particle shape and/or particle size. More specifically, the blast-treatment is conducted by a process comprising the steps of (1) blasting the surface to be sputtered of a sputtering target with a blasting material in the form of a finely divided powder having particle diameters falling within the range of 50 to 500 $\mu$m to remove the strongly adhered impurities; and then, (2) further blasting the thus-blasted surface with a blasting material in the form of a finely divided powder having particle diameters falling within the range of 10 to 110 $\mu$m to reduce the surface roughness (Ra) of the target surface; wherein the blasting material used in the step (1) is composed of a substance different from that of the blasting material used in the step (2), or, the center value of the particle diameters of the blasting material used in the step (1) is larger than the center value of the particle diameters of the blasting material used in the step (2). By the term "center value of the particle diameters" used herein we mean the center value of the range within which the particle diameters fall. For example, the center value of the particle diameters falling within the range of 50 to 150 μm is 100 μm.

Preferably, the blasting material used in the step (1) is selected from finely divided alumina powders and finely divided carbon silicide powders, and the blasting material used in the step (2) is a zirconia powder composed of spherical finely divided particles.

If desired, the blasting treatment can be conducted in more than two steps employing blasting materials having different particle sizes which become smaller in the order of step. The time of repetition of blasting is usually up to three or four. If the blasting is repeated too many times under different conditions, the workability and working efficiency are lowered.

When the blasting is repeated twice or more times, the blasting material used in the first stage is preferably chosen from those which are inexpensive, such as for example alumina and carbon silicide, because the blasting material is readily stained with impurities on the sputtering target. In the succeeding stage or stages, the blasting material is not readily stained with the impurities, and can be repeatedly used, and thus, an expensive high-performance blasting material such as spherical zirconia particles can be advantageously used.

The material of the sputtering target to be blasted in the process of the present invention is not particularly limited. As examples of the material of the sputtering target, there can be mentioned Cr, Cr-Mo, Cr-V, Cr-W, Ni-Cr-Si, Ni-Cr-Si-Al, CoCr-Ta, Mo, Ti, Al, !Si, MoSi, C, ITO, ZAO, STO, BSTO, MgO, $SiO_2$, Si and $Si_3N_4$.

In the case where a sputtering target to be blasted is composed of an oxide or a nitride, as illustrated in FIG. 1, an alumina powder 3 is spread on an aluminum plate 4 under the target 5 at sintering, or, as illustrated in FIG. 2, the sintered target 5 is covered with an alumina powder 3 at sintering (if desired an aluminum powder 3 is spread on an aluminum plate 4 under the target 5), for preventing crack formation or warping, and thus, the sintered target has a salient proportion of aluminum impurities on the surface thereof. The blasting procedure of the present invention is advantageously employed for treating this sintered oxide or nitride target. Usually a practically acceptable content of aluminum as an impurity is not larger than 30 ppm. By the process of the present invention, the content of aluminum impurity in the surface layer on the side to be sputtered of the sintered body can be reduced to a level not larger than 30 ppm even though the surface to be sputtered of the sintered body is not planar but has a raised portion. The impurities on the other surfaces of the sintered body also can be reduced to a satisfactory level by the process of the present invention.

Figure 3B:
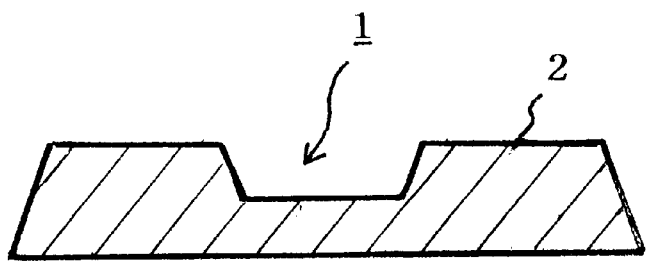
Figure 3C:
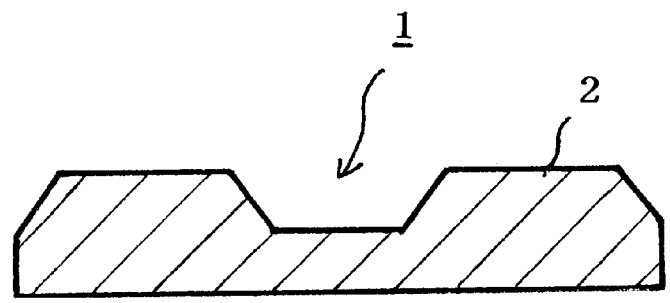
FIG. 3c, FIG. 3d and FIG. 3e are cross-sectional views illustrating other examples of high-efficiency sputtering targets.
Figure 3D:
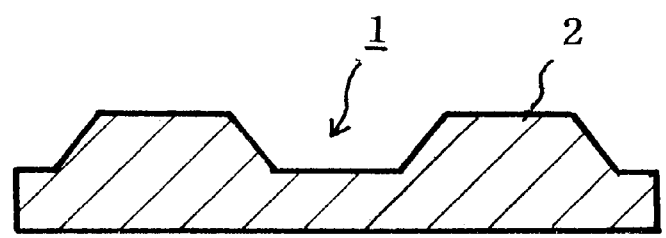
Figure 3E:
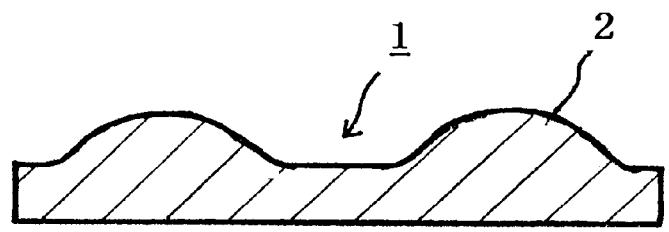

Therefore, the process of the present invention can be employed for treating not only a sputtering target having a planar sputtering surface but also a sputtering target having a complex surface configuration, e.g., a raised portion on the sputtering surface. One example of the sputtering target having a raised portion is a high-efficiency sputtering target illustrated in FIG. 3a and FIG. 3b. FIG. 3a is a perspective illustration of the high efficiency sputtering target and FIG. 3b is a cross-sectional view taken on line A—A of FIG. 3a.

This high-efficiency sputtering target 1 has a raised portion 2 on the sputtering surface. Other examples of high-efficiency sputtering target having a raised portion are illustrated in cross-sectional views of FIG. 3c, FIG. 3d and FIG. 3e. The sputtering targets 1 illustrated in these figures have raised portions 2 of different configurations on each upper surface thereof. The corner or edge portions of the target surfaces of the targets shown in FIG. 3b, FIG. 3c, FIG. 3d and FIG. 3e are preferably rounded (not shown in these figures).

A sputtering target preferably has a surface roughness (Ra) of not larger than 4 μm to minimize the occurrence of nodules at sputtering. By the process of the present invention, target surfaces having a surface roughness of 0.5 to 4 μm can be obtained.

The blast-treatment of the target surface is not costly and enables of removing impurities on the target surface at a high rate. The treated target surface has an isotropic and reduced surface roughness (Ra). This is in contrast to a target surface treated by a surface grinding machine, which has anisotropic grinding marks.

The blast-treated sputtering target is finally fabricated into a final sputtering target by an ordinary procedure, for example, by bonding the blast-treated target to a copper backing plate by using an indium solder.

The invention will now be described specifically by the following examples that by no means limit the scope of the invention.

In the examples, the contents of impurities such as aluminum, silicon and ziruconium and the content of tin oxide in the surface layer on the side to be sputtered of an ITO sputtering target were determined as follows. The surface to be sputtered is analyzed by X-ray fluorescence method using an X-ray fluorescence spectrometer "Rigaku 3080-E3" supplied by Rigaku Denki Kougyou Co. wherein the voltage of an X-ray tube made of rhodium was 50 kV, the current of the X-ray tube was 50 mA, and the irradiation area was a circle with a diameter of 20 mm.

EXAMPLE 1

In a 10 liter nylon pot having put therein resin balls with an iron core having a ball diameter of 15 mm, 4,500 g of an indium oxide powder, 500 g of a tin oxide powder, 125 g of a polycarboxylate dispersant (solid content of 40% by weight), 100 g of an acrylic resin emulsion binder (solid content of 50% by weight) and 1,114 g of pure water were mixed together for 16 hours by using a rotational ball mill. The thus-obtained slurry was thoroughly deaerated and cast in a mold to obtain an ITO molding having a high-efficiency shape illustrated in FIG. 3a and FIG. 3b. The ITO molding was subjected to cold isostatic pressing at a pressure of 3 ton/$cm^2$, and then, the binder was removed therefrom.

An alumina powder was spread at a thickness of 5 mm over an aluminum plate, and the ITO molding was placed on the spread aluminum powder, as illustrated in FIG. 1. The ITO shaped body was sintered by a pressureless sintering method at 1,550° C. for 5 hours to give a sintered body having a density of 99.5% and a size of 130 mm×405 mm×10.5 mm (thickness). The surface of the sintered body to be sputtered had a surface roughness (Ra) of 2.1 μm, and the contents of impurities and tin oxide in its surface layer were as follows:

Si: 20 ppm, Al: 760 ppm and Zr: smaller than 30 ppm.
$SnO_2$: 7.8 wt. %

The surface to be sputtered was blast-treated at a blasting pressure of 4 kg/$cm^2$ for a blasting time of 80 seconds by using a blasting material composed of spherical zirconia beads having particle diameters falling within the range of 25 to 106 μm (tradename "YTZ53W" supplied by Tosoh Corporation). The distance between the blasting nozzle and the surface to be sputtered was 150 mm. The blast-treated surface had a surface roughness (Ra) of 1.6 μm, and the contents of impurities and tin oxide in its surface layer were as follows:

Si: 20 ppm, Al: smaller than 30 ppm and Zr: smaller than 30 ppm.

$SnO_2$: 10.1 wt. %

A sputtering target can be fabricated from the blast-treated sintered body, for example, by bonding it to a copper backing plate by using an indium solder.

EXAMPLE 2

An alumina powder was spread at a thickness of 5 mm over an aluminum plate, an ITO shaped body of a high-efficiency shape illustrated in FIG. 3a and FIG. 3b, which was the same as that used in Example 1, was placed on the spread aluminum powder, and the ITO shaped body was covered with an aluminum powder, as illustrated in FIG. 2. The ITO shaped body was sintered by a pressureless sintering method at 1,550° C. for 5 hours to give a sintered body having a density of 99.8% and a size of 130 mm×405 mm×10.5 mm (thickness). The surface of the sintered body to be sputtered had a surface roughness (Ra) of 4.1 μm, and the contents of impurities and tin oxide in its surface layer were as follows.

Si: 20 ppm, Al: 2,500 ppm and Zr: smaller than 30 ppm.

$SnO_2$: 8.1 wt. %

The surface to be sputtered was blast-treated at a blasting pressure of 4 kg/cm² for a blasting time of 240 seconds by using a blasting material composed of a carbon silicide powder having particle diameters falling within the range of 125 to 149 μm (tradename "Fuji-alundum C-100" supplied by Fuji Mfg. Co.). The distance between the blasting nozzle and the surface to be sputtered was 150 mm. The blast-treated surface had a surface roughness (Ra) of 3.8 μm, and the contents of impurities and tin oxide in its surface layer were as follows.

Si: 60 ppm, Al: smaller than 30 ppm and Zr: smaller than 30 ppm.

$SnO_2$: 10.2 wt. %

EXAMPLE 3

The target blast-treated in Example 2 was again blast-treated. Namely the blast-treated surface to be sputtered was again blast-treated at a blasting pressure of 4 kg/cm² for a blasting time of 80 seconds by using a blasting material composed of spherical zirconia beads having particle diameters falling within the range of 25 to 106 μm (tradename "YTZ53W" supplied by Tosoh Corporation). The distance between the blasting nozzle and the surface to be sputtered was 150 mm. The blast-treated surface had a surface roughness (Ra) of 2.2 μm, and the contents of impurities and tin oxide in its surface layer were as follows.

Si: 20 ppm, Al: smaller than 30 ppm and Zr: smaller than 30 ppm.

$SnO_2$: 10.1 wt. %

EXAMPLE 4

The target blast-treated in Example 2 was again blast-treated. Namely the blast-treated surface to be sputtered was again blast-treated at a blasting pressure of 4 kg/cm² for a blasting time of 240 seconds by using a blasting material composed of an alumina powder having particle diameters falling within the range of 177 to 210 μm (tradename "Fuji-alundum WA-80" supplied by Fuji Mfg. Co.). The distance between the blasting nozzle and the surface to be sputtered was 150 mm. The blast-treated surface had a surface roughness (Ra) of 3.9 μm, and the contents of impurities and tin oxide in its surface layer were as follows.

Si: 20 ppm, Al: 120 ppm and Zr: smaller than 30 ppm.

$SnO_2$: 10.0 wt. %

EXAMPLE 5

The target blast-treated in Example 4 was further blast-treated. Namely the blast-treated surface to be sputtered was again blast-treated at a blasting pressure of 4 kg/cm² for a blasting time of 80 seconds by using a blasting material composed of spherical zirconia beads having particle diameters falling within the range of 25 to 106 μm (tradename "YTZ53W" supplied by Tosoh Corporation). The distance between the blasting nozzle and the surface to be sputtered was 150 mm. The blast-treated surface had a surface roughness (Ra) of 2.4 μm, and the contents of impurities and tin oxide in its surface layer were as follows.

Si: 20 ppm, Al: smaller than 30 ppm and Zr: smaller than 30 ppm.

$SnO_2$: 10.1 wt. %

EXAMPLE 6

An alumina powder was spread at a thickness of 5 mm over an aluminum plate, and an ITO shaped body of a planar shape was placed on the spread aluminum powder, as illustrated in FIG. 1. The ITO shaped body was sintered by a pressureless sintering method at 1,550° C. for 5 hours to give a sintered body having a density of 99.5% and a size of 130 mm×405 mm×10.5 mm (thickness). The surface of the sintered body to be sputtered had a surface roughness (Ra) of 2.3 μm, and the contents of impurities and tin oxide in its surface layer were as follows:

Si: 20 ppm, Al: 760 ppm and Zr: smaller than 30 ppm.

$SnO_2$: 7.5 wt. %

The surface to be sputtered was blast-treated at a blasting pressure of 4 kg/cm² for a blasting time of 80 seconds by using a blasting material composed of spherical zirconia beads having particle diameters falling within the range of 25 to 106 μm (tradename "YTZ53W" supplied by Tosoh Corporation). The distance between the blasting nozzle and the surface to be sputtered was 150 mm. The blast-treated surface had a surface roughness (Ra) of 1.8 μm, and the contents of impurities and tin oxide in its surface layer were as follows:

Si: 20 ppm, Al: smaller than 30 ppm and Zr: smaller than 30 ppm.

$SnO_2$: 10.4 wt. %

EXAMPLE 7

The ITO sintered body as sintered by the same method as that mentioned in Example 6 was treated by a surface grinding machine using a #400 grinding stone to give a sintered body having a size of 127.0 mm×400.0 mm×6.35 mm (thickness). The surface of the sintered body to be sputtered had a surface roughness (Ra) of 1.3 μm as measured in the direction parallel to the grinding direction and 1.7 μm as measured in the direction perpendicular to the grinding direction, and the contents of impurities and tin oxide in its surface layer were as follows:

Si: 20 ppm, Al: smaller than 30 ppm and Zr: smaller than 30 ppm.

$SnO_2$: 10.2 wt. %

The surface to be sputtered was blast-treated at a blasting pressure of 4 kg/cm² for a blasting time of 80 seconds by using a blasting material composed of spherical zirconia beads having particle diameters falling within the range of 25 to 106 μm (tradename "YTZ53W" supplied by Tosoh Corporation). The distance between the blasting nozzle and the surface to be sputtered was 150 mm. The blast-treated surface had a surface roughness (Ra) of 1.6 μm as measured in both directions parallel and perpendicular to the grinding direction, and the contents of impurities and tin oxide in its surface layer were as follows:

Si: 20 ppm, Al: smaller than 30 ppm and Zr: smaller than 30 ppm.

$SnO_2$: 10.4 wt. %

COMPARATIVE EXAMPLE1

The ITO sintered body as sintered by the same method as that mentioned in Example 2 was blast-treated. Namely the surface of the ITO sintered body was blast-treated at a blasting pressure of 4 kg/cm² for a blasting time of 80 seconds by using a blasting material composed of an alumina powder having particle diameters falling within the range of 595 to 707 μm (tradename "Fuji-alundum WA-30" supplied by Fuji Mfg. Co.). The distance between the blasting nozzle and the surface to be sputtered was 150 mm. The blast-treated surface had a surface roughness (Ra) of 5.6 μm.

What is claimed is:

1. A process for preparing a sputtering target which comprises the steps of:
   (1) blasting a surface to be sputtered of a sputtering target with a blasting material in the form of a finely divided powder having particle diameters falling within the range of 50 to 500 μm; and then
   (2) further blasting the thus-blasted surface with a blasting material in the form of a finely divided powder having particle diameters falling within the range of 10 to 110 μm to remove impurities staining the surface to be sputtered;
   wherein the blasting material used in the step (1) is composed of a substance different from that of the blasting material used in the step (2), or, the center value of the particle diameters of the blasting material used in the step (1) is larger than the center value of the particle diameters of the blasting material used in the step (2).

2. The process for preparing a sputtering target according to claim 1, wherein said blasting material used in the step (1) is selected from the group consisting of a finely divided alumina powder and a finely divided carbon silicide powder, and said blasting material used in the step (2) is a zirconia powder composed of spherical finely divided particles.

3. The process for preparing a sputtering target according to claim 1, wherein said sputtering target has a raised portion on its surface to be sputtered.

4. The process for preparing a sputtering target according to claim 3, wherein said blasting material used in the step (1) is selected from the group consisting of a finely divided alumina powder and a finely divided carbon silicide powder, and said blasting material used in the step (2) is a zirconia powder composed of spherical finely divided particles.

5. A process for surface-treating a sputtering target which comprises the steps of:
   (1) blasting a surface to be sputtered of a sputtering target with a blasting material in the form of a finely divided powder having particle diameters falling within the range of 50 to 500 μm; and then
   (2) further blasting the thus-blasted surface with a blasting material in the form of a finely divided powder having particle diameters falling within the range of 10 to 110 μm to remove impurities staining the surface to be sputtered;
   wherein the blasting material used in the step (1) is composed of a substance different from that of the blasting material used in the step (2), or, the center value of the particle diameters of the blasting material used in the step (1) is larger than the center value of the particle diameters of the blasting material used in the step (2).

6. The process for surface-treating a sputtering target according to claim 5, wherein said blasting material used in the step (1) is selected from the group consisting of a finely divided alumina powder and a finely divided carbon silicide powder, and said blasting material used in the step (2) is a zirconia powder composed of spherical finely divided particles.

7. The process for surface-treating a sputtering target according to claim 5, wherein said sputtering target has a raised portion on its surface to be sputtered.

8. The process for surface-treating a sputtering target according to claim 7, wherein said blasting material used in the step (1) is selected from the group consisting of a finely divided alumina powder and a finely divided carbon silicide powder, and said blasting material used in the step (2) is a zirconia powder composed of spherical finely divided particles.

* * * * *